US007397216B2

(12) United States Patent
Schroeder et al.

(10) Patent No.: US 7,397,216 B2
(45) Date of Patent: Jul. 8, 2008

(54) CIRCUIT FOR MONITORING HARMONIC DISTORTION IN THE POWER SUPPLY OF A SYNCHRONOUS ELECTRICAL MACHINE WITH PERMANENT MAGNET EXCITATION

(75) Inventors: Ulrich Schroeder, Mont Saint Aignan (FR); Maurice Brunet, Sainte Colombe Pres Vernon (FR); Bertrand Haffray, Saint Etienne du Rouvray (FR)

(73) Assignee: Societe de Mecanique Magnetique, Saint Marcel (FR)

( * ) Notice: Subject to any disclaimer, the term of this patent is extended or adjusted under 35 U.S.C. 154(b) by 71 days.

(21) Appl. No.: 11/591,233

(22) Filed: Nov. 1, 2006

(65) Prior Publication Data

US 2007/0096680 A1 May 3, 2007

(30) Foreign Application Priority Data

Nov. 3, 2005 (FR) .................................. 05 11189

(51) Int. Cl.
*H02P 6/10* (2006.01)
(52) U.S. Cl. ........................ 318/629; 318/565; 318/611; 318/723
(58) Field of Classification Search ................. 318/138, 318/254, 434, 439, 471, 565, 611, 621, 623, 318/629, 632, 720–724; 388/903, 909, 911
See application file for complete search history.

(56) References Cited

U.S. PATENT DOCUMENTS

| 4,804,894 | A | * | 2/1989 | Machida et al. ............. 388/812 |
| 5,321,598 | A | * | 6/1994 | Moran ......................... 363/41 |
| 5,731,965 | A | * | 3/1998 | Cheng et al. ................. 363/41 |
| 5,757,099 | A | * | 5/1998 | Cheng et al. ................ 307/105 |
| 2005/0207190 | A1 | * | 9/2005 | Gritter ......................... 363/40 |
| 2006/0038531 | A1 | * | 2/2006 | Wakabayashi et al. ...... 318/807 |

FOREIGN PATENT DOCUMENTS

WO WO 99/29029 6/1999

OTHER PUBLICATIONS

Ching-Yin Lee et al: "Effects of Nonsinusoidal Voltage on the Operation Performance of a Three-phrase Induction Motor," IEEE Transactions on Energy Conversion, IEEE Service Center, Piscataway, NJ, US, vol. 14, No. 2, Jun. 1999, pp. 193-201.

* cited by examiner

*Primary Examiner*—Bentsu Ro
(74) *Attorney, Agent, or Firm*—Weingarten, Schurgin, Gagnebin & Lebovici LLP

(57) ABSTRACT

The present invention provides a circuit for monitoring harmonic distortion in the power supply of a synchronous electrical machine with permanent magnet excitation that comprises a rotor without a damper cage, a stator with first, second, and third windings, a frequency converter, and control circuits for controlling the frequency converter. The monitoring circuit comprises means for obtaining at least one signal representative of the current in the first winding of the stator and at least one signal representative of the current in the second winding of the stator; a circuit for generating synchronizing pulses reflecting the electrical frequency fn of rotation of the rotor relative to the stator; means for determining a signal representative of the current in the third winding of the stator; a set of band-stop notch filters respectively receiving said signals representative of the currents in the first, second, and third windings, and each presenting a center frequency that is servo-controlled to the electrical frequency fn of rotation of the rotor, in order to reject the harmonic corresponding to said electrical frequency fn; a set of measurement circuits for measuring the harmonics that remain in the signals output by each of the band-stop notch filters; and a comparator circuit for continuously comparing the greatest of the values of the signals from the measurement circuits relative to an alarm threshold.

13 Claims, 3 Drawing Sheets

CIRCUIT FOR MONITORING HARMONIC DISTORTION IN THE POWER SUPPLY OF A SYNCHRONOUS ELECTRICAL MACHINE WITH PERMANENT MAGNET EXCITATION

This application claims priority to French application No. 05 11189 filed Nov. 3, 2005.

FIELD OF THE INVENTION

The present invention relates to a circuit for monitoring harmonic distortion in the power supply of a synchronous electrical machine with permanent magnet excitation that comprises a rotor without a damper cage, a stator with first, second, and third windings, a frequency converter, and control circuits for controlling the frequency converter.

BACKGROUND OF THE INVENTION

Synchronous machines with permanent magnet excitation controlled by a variable-speed frequency converter and that can operate as a motor or as a generator, present very high power density per unit volume.

Machines of that type generate losses that are very low in the rotor and they are characterized by low negative stiffness. Such electrical machines are therefore well adapted for use in combination with magnetic bearings.

Such synchronous machines can operate at very high speed.

In one particular technology, the rotor of the synchronous machine comprises permanent magnets bonded to the surface of a solid shaft of magnetic steel. To avoid separation due to centrifugal forces, use is made of a binding band of carbon fibers or glass fibers. That technology is compatible with linear speeds that may be as great as 300 meters per second (m/s).

For power levels above about 50 kilowatts (kW), the stator of the machine is generally cooled by a liquid. Air or some other cooling gas can also be introduced into the airgap, thereby ventilating the airgap, but circumstances nevertheless exist in which it is difficult to cool such a machine.

Synchronous machines with permanent magnet excitation have a rotor without a damper cage. It is therefore necessary for them to be controlled at variable speed by a frequency converter. The converter feeds the stator coils of the machine with currents that are variable in amplitude and in frequency.

As mentioned above, it is possible to operate in motor mode or in generator mode. Variable-speed control in an open loop—similar to controlling a synchronous motor—further requires electronic stabilization of angular oscillations in order to avoid any risk of losing synchronization.

In order to improve the robustness of the system, it is preferable to use information concerning the angular position of the machine in order to synchronize the converter. Such external synchronization enables a rotating machine to be resynchronized automatically in the event of synchronization being lost.

Because of the way it operates, the frequency converter generates harmonics in the phase currents of the machine. These harmonics, and also direct current (DC), produce additional losses in the stator and the rotor. Rotor losses which appear under the binding band, in the magnets and in the solid shaft, are particularly critical in this type of machine. The composite binding band is a thermal insulator which prevents the rotor from cooling effectively. Even low levels of loss can lead rapidly to temperatures that are above the acceptable limit, which is situated at about 150° C.

To remedy that problem, proposals have already been made to use power filters for reducing harmonic content to below the acceptable value. For a machine with power greater than 50 kW, the order of magnitude for a maximum acceptable threshold corresponds to the total harmonic content being about 5% to 10%.

Even when using power filters, it can happen in practice that harmonic distortion increases to above the maximum acceptable value, e.g. because of instability in the electronic circuits controlling the frequency converter, or indeed because of a failure in a power filter or in the interconnections.

Under such circumstances, the temperature of the rotor increases very quickly, running the risk of destroying the binding band for holding on the permanent magnet, and then to the entire machine being destroyed.

Conventional solutions, e.g. monitoring the temperature of the stator, do not enable such localized heating to be avoided, particularly when it takes place in the binding bands.

OBJECTS AND SUMMARY OF THE INVENTION

An object of the present invention is to remedy the above-mentioned drawbacks and to enable the machine to perform an emergency stop in the event of heating caused by losses in the rotor, prior to the machine being damaged or destroyed.

Another object of the invention is to provide a solution that is simple and inexpensive, that is reliable, and that does not require fragile or expensive components to be implemented and that does not require any change to the operation of the converter associated with the synchronous machine.

These objects are achieved by a circuit for monitoring harmonic distortion in the power supply of a synchronous electrical machine with permanent magnet excitation that comprises a rotor without a damper cage, a stator with first, second, and third windings, a frequency converter, and control circuits for controlling the frequency converter, the monitoring circuit comprising means for obtaining at least one signal representative of the current in the first winding of the stator and at least one signal representative of the current in the second winding of the stator; a circuit for generating synchronizing pulses reflecting the electrical frequency fn of rotation of the rotor relative to the stator; means for determining a signal representative of the current in the third winding of the stator; a set of band-stop notch filters respectively receiving said signals representative of the currents in the first, second, and third windings, and each presenting a center frequency that is servo-controlled to the electrical frequency fn of rotation of the rotor, in order to reject the harmonic corresponding to said electrical frequency fn; a set of measurement circuits for measuring the harmonics that remain in the signals output by each of the band-stop notch filters; and a comparator circuit for continuously comparing the greatest of the values of the signals from the measurement circuits relative to an alarm threshold.

The band-stop notch filters may be of the switched capacitor type.

Advantageously, the band-stop notch filters present a clock frequency n.fn that is equal to an integer number n of times the value of the electrical frequency fn of rotation of the rotor.

In a particular embodiment, the circuit includes a frequency multiplier circuit with a phase-locked loop for producing said clock frequency n.fn from the electrical frequency fn of rotation of the rotor delivered by said circuit for generating synchronizing pulses.

Preferably, said means for determining the signal representative of the current in the third winding of the stator comprise an analog circuit for calculating the value of the current in the third winding from the measured values of the current in the second and third windings.

In a particular embodiment, each of said measurement circuits for measuring the remaining harmonics comprises a measurement circuit of the squarelaw or multimeter type.

The monitoring circuit of the invention may further comprise filter elements interposed between the measurement circuits for measuring the remaining harmonics and the comparator circuit.

In a particular embodiment, the circuit for generating synchronizing pulses comprises a "revolution pulse" type sensor for sensing the speed of rotation of the rotor.

In another possible embodiment, the circuit includes means for obtaining signals representative of voltage for each outlet phase of the converter, and said signals representative of the voltages and said signal representative of the current in the first winding of the stator are applied to the circuit for generating synchronizing pulses.

The invention also provides a unit for controlling a synchronous electrical machine with permanent magnet excitation that comprises a rotor without a damper cage and a stator with first, second, and third windings, which control unit comprises a frequency converter and control circuits for controlling the frequency converter, wherein the unit includes a circuit for monitoring harmonic distortion in the power supply to the synchronous machine, as defined above, and in that the circuit for generating synchronizing pulses representative of the electrical frequency fn of rotation of the rotor is incorporated in said control circuits for controlling the frequency converter.

The invention also provides a driver device for driving a rotary assembly mounted on active magnetic bearings, the driver device comprising a synchronous electrical machine fitted with a control unit as defined above.

The invention applies in particular to a driver device in which the rotor of the synchronous machine comprises a solid shaft of magnetic steel having permanent magnets bonded to its surface, which magnets are also held on by means of at least one binding band of carbon fibers or glass fibers.

The invention also applies advantageously to a driver device comprising a synchronous machine for driving a turbomolecular pump, a turbomachine, or a tool-carrier spindle rotating at speeds of the order of several tens of thousands of revolutions per minute.

BRIEF DESCRIPTION OF THE DRAWINGS

Other characteristics and advantages of the invention appear from the following description of particular embodiments given as examples with reference to the accompanying drawings, in which.

MORE DETAILED DESCRIPTION

Figure 1:
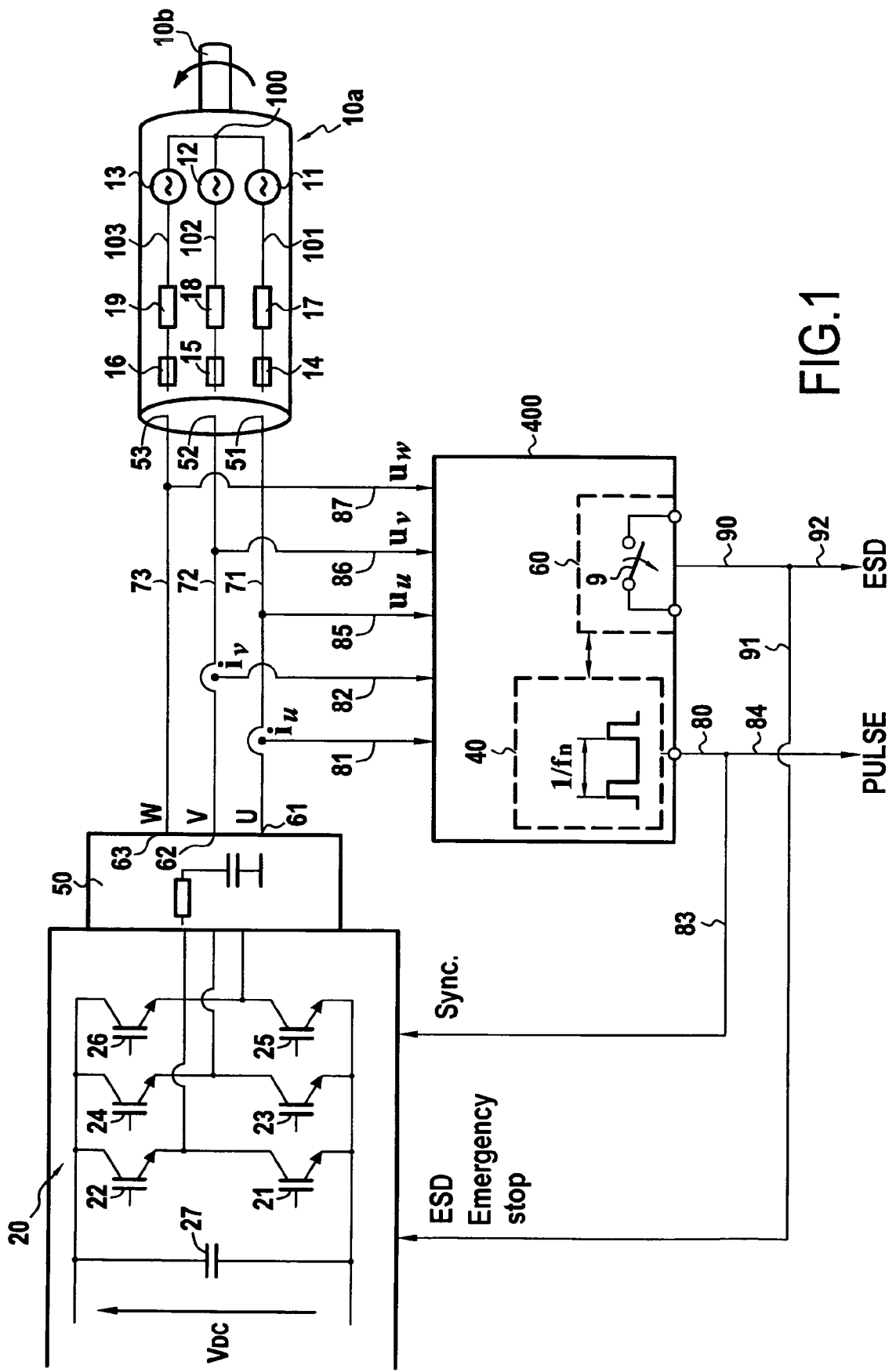
FIG. 1 is an overall schematic view of the main components of a synchronous motor with permanent magnet excitation to which the monitoring circuit of the invention is applied.

FIG. 1 shows an example of a permanent magnet synchronous machine to which the invention is applicable.

In FIG. 1, there is symbolized a stator 10a of a synchronous motion with permanent magnet excitation, having windings 101, 102, and 103 corresponding to the phases U, V, and W, and that are connected between a common point 100 and terminals 51, 52, and 53.

In operation, each winding 101, 102, and 103 for each phase U, V, and W can be represented by a respective electromotive force (emf) 11, 12, and 13 corresponding to the voltage induced when unloaded, a resistor 14, 15, and 16, and an inductor 17, 18, and 19.

The terminals 51, 52, and 53 of the stator 10 are connected by connections 71, 72, and 73 to outlet terminals 61, 62, and 63 of a frequency converter or "inverter" 20. Nevertheless, a power filter 50 is advantageously disposed at the outlet of the frequency converter 20, in which case the terminals 61, 62, and 63 may be located at the outlet from the filter 50.

The frequency converter 20 is associated with a converter control circuit 40. The power stage of the converter 20 comprises a bridge of six electronic switches 21 to 26 powered from a direct voltage source $V_{DC}$ that may be associated with a capacitor 27. The switches 21 to 26 are controlled from the control circuit 40 by control wires 80, 83. The switches are subjected to ON/OFF control at high frequency, of the order of 5 kilohertz (kHz) to 50 kHz, using the pulse width modulation (PWM) technique. As a result, rectangular voltage pulses appear across the terminals of the stator 10a of the motor with amplitude equal to $+V_{DC}$ or $-V_{DC}$.

The stator currents $i_u$, $i_v$, $i_w$ can be subjected to sinewave modulation or to rectangular-wave modulation. Sinewave modulation is more complicated in terms of signal processing, but contributes to improving the performance of the motor insofar as rotor heating is smaller and rotation is of better quality. Rectangular-wave modulation is simpler to implement and is used in particular for low-power motors (motors of the brushless type).

The control circuit 40 for the frequency converter 20 essentially comprises a calculation circuit which receives, via lines 85, 86, and 87, voltage information signals that are continuously available at the outlet terminals 61, 62, and 63 of the converter 20 or at the inlet terminals 51, 52, and 53 of the stator 10a of the motor.

Similarly, information signals $i_u$, $i_v$ relating to the currents flowing in the windings 101, 102 are sensed in the converter 20 via lines 81, 82, and are likewise applied to the converter control circuit 40.

The control circuit 40 serves to issue synchronizing pulse signals on the lines 80, 83, and 84, these synchronizing pulse signals having positive fronts indicative of the angular position of the rotor 10b relative to the stator 10a.

The control circuit 40 also issues a speed signal on the line 84 in the form of one pulse per revolution for the purpose of controlling an automatic unbalance control system associated with active magnetic bearings supporting a rotary assembly driven by the synchronous motor.

Advantageously, the control circuit 40 for the frequency converter 20, which control circuit may also incorporate an automatic unbalance control system, is embodied in the manner described in patent document WO 98/11662. Such an embodiment serves in particular to avoid using angular position sensors, and it combines readily with the monitoring circuit of the present invention as described below. In particular, the synchronizing pulse signals generated in the control circuit 40 can be used both for synchronizing the frequency converter 20 and for detecting non-synchronous harmonics in the manner described below.

Nevertheless, the present invention is compatible with other embodiments of control circuits for the frequency converter 20. Under such circumstances, it suffices to have a circuit for generating synchronizing pulse signals in order to generate a signal representing the rotation harmonic (or electrical frequency) fn of the rotor 10b of the synchronous motor, which rotation harmonic represents the useful portion of the current that produces torque within the motor. By way of example, if there is a rotary speed sensor of the "revolution pulse" type, then the signals coming from the sensor can be used directly for synchronizing the monitoring circuit, and it is not necessary for the control circuit 40 to receive voltage information signals taken from each phase at the outlet from the converter.

In general, the rotation harmonic or electrical frequency fn is given by the following relationship:

$$fn = p * f_{mec}$$

where:
$f_{mec}$=mechanical frequency;
p=number of pairs of motor poles.

Figure 3:
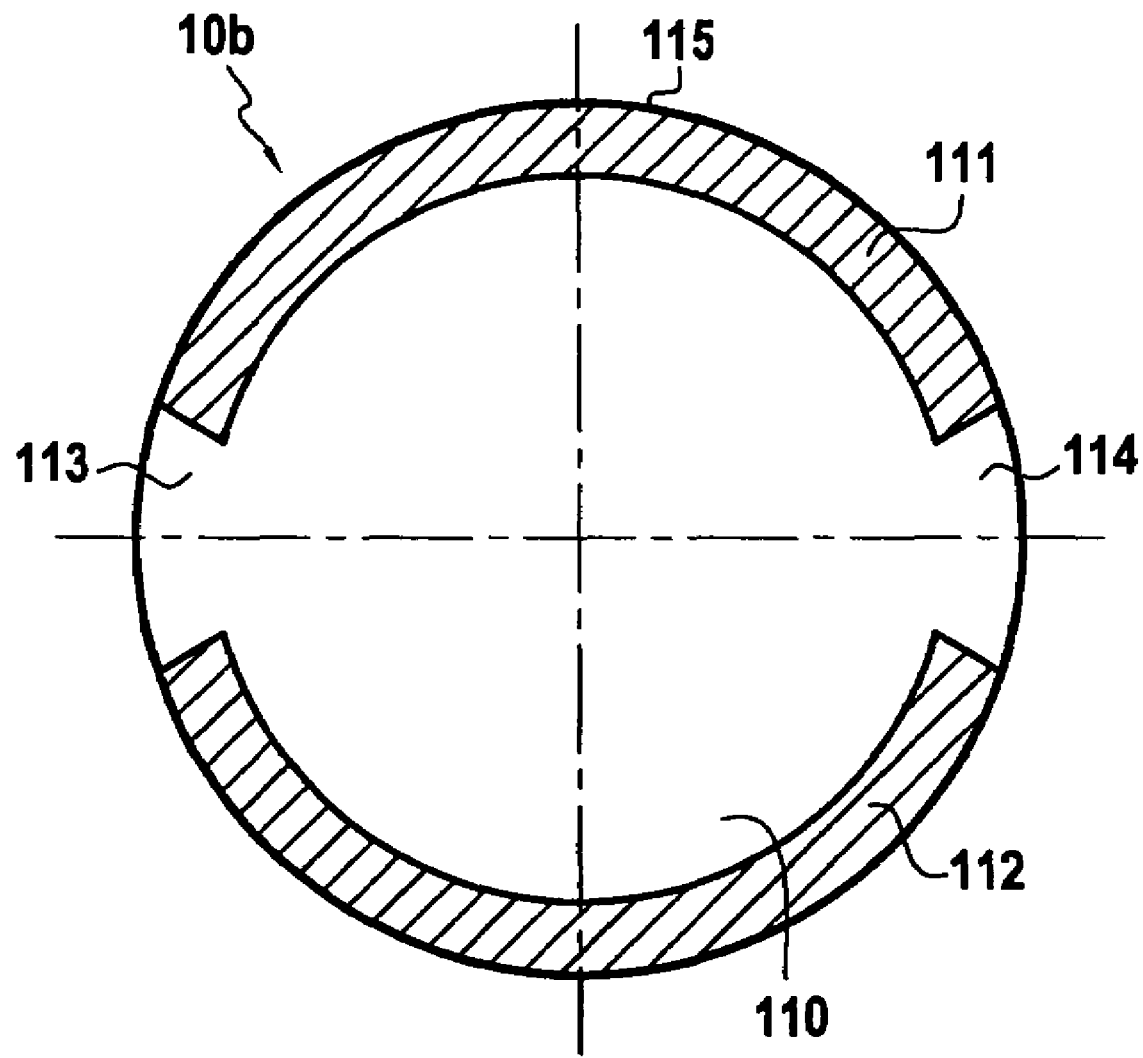
FIG. 3 is a section view of an example of a synchronous motor rotor to which the invention is applicable.

FIG. 3 shows an embodiment of a rotor 10b fitted with permanent magnets 111, 112.

The rotor 10b can thus be constituted by a solid shaft 110 of magnetic steel having permanent magnets 111, 112 bonded to its surface, e.g. samarium cobalt magnets received in recesses defined by portions 113, 114 of the solid shaft 110. One or more carbon or glass fiber binding bands 115 hold the permanent magnets 111, 112 in position, preventing them from becoming separated, particularly in the event of very high speeds of rotation, which may be of the order of several tens of thousands of revolutions per minute (rpm) associated with linear speeds that may be as high as 300 m/s.

As mentioned above, the composite material binding band 115 is a thermal insulator that prevents the rotor 10b from cooling effectively, so even low levels of rotor losses, caused by the presence of harmonics in the motor phase currents, can lead to temperatures that exceed the acceptable limit, e.g. of 150° C.

The circuit 60 of the invention (which can be associated with the converter control circuit 40 in a unit 400 for controlling a synchronous machine with permanent magnet excitation), serves to monitor in real time the harmonic distortion in the phases of the machine and to initiate an emergency stop of the machine by acting on control lines 90, 91, and 92 associated with a relay contact 9, in the event of harmonic distortion exceeding a predetermined threshold.

Various digital or analog solutions exist for measuring and analyzing current harmonics in the phases of an electrical machine. Nevertheless those various solutions are relatively expensive and difficult to implement on a machine that is in operation.

The monitoring circuit 60 of the present invention is independent of the function of the converter 20 and is particularly simple, inexpensive, and reliable, given that it only requires a pulse signal to be produced that can serve both for detecting harmonics and, optionally, for synchronizing the converter 20, and also, where appropriate, for synchronizing a system for rejecting synchronous vibration due to unbalance of the rotor.

Figure 2:
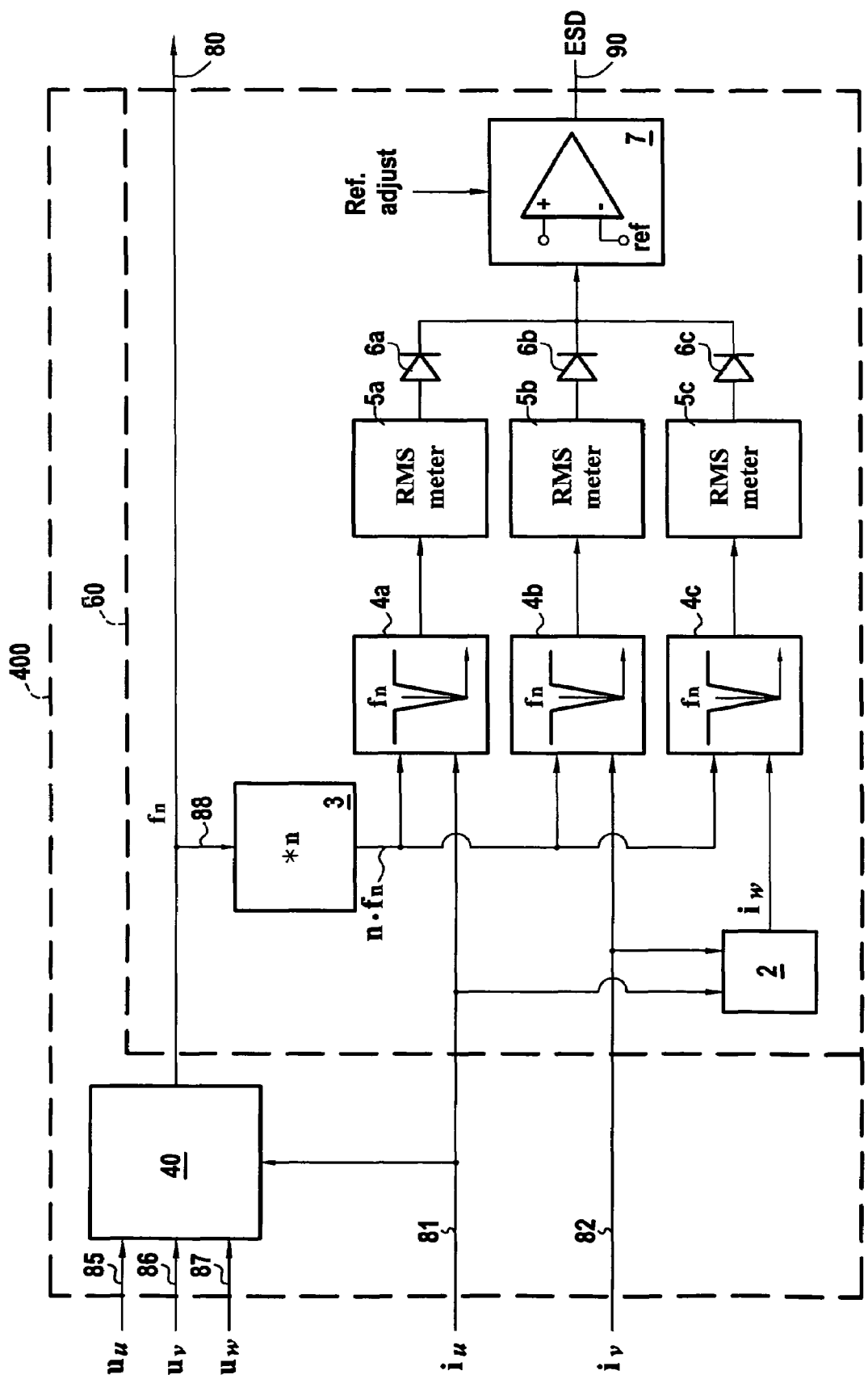
FIG. 2 is a block diagram of an example of a circuit of the invention for monitoring harmonic distortion.

As described above with reference to FIG. 1, and as can also be seen in FIG. 2, the circuit of the invention receives input information signals that are available at the outlet from the frequency converter 20, i.e. signals representative of current information $i_u$, $i_v$, and of voltage information $u_u$, $u_v$, $u_w$.

The monitoring circuit of the invention includes a function of rejecting the rotation harmonic fn, which is the useful portion of the current that produces torque, and a function that consists in then analyzing the remaining non-synchronous harmonics, which constitute the non-useful portion of the current that generates losses. An emergency stop of the machine is triggered if the non-synchronous harmonics exceed a certain critical threshold that would lead to critical heating.

An embodiment of the monitoring circuit 60 of the invention is shown in FIG. 2.

As explained with reference to FIG. 1, the control circuit 40 that receives the voltage information signals $u_u$, $u_v$, $u_w$ and at least one current information signal $i_u$, serves to generate a pulse signal representing the rotation harmonic (electrical frequency) fn of the rotor 10b, on a line 80 that can be connected to the converter 20, and on a line 88 connected to a frequency multiplier 3.

The monitoring circuit 60 also receives over lines 81 and 82, current information signals $i_u$ and $i_v$ as measured in the two phases U and V by current sensors.

The current in the phase W could also be measured using a current sensor. Nevertheless, and in more simple manner, the current $i_w$ in the third phase W is calculated in a simple analog circuit 2 on the basis of the current information signals $i_u$ and $i_v$ as supplied by the lines 81 and 82, using the following relationship:

$$i_u + i_v + i_w = 0$$

The current information signals $i_u$, $i_v$, $i_w$ concerning the three phases are applied to three respective high-order notch filters 4a, 4b, and 4c in order to remove the rotation harmonic fn.

By way of example, the band-stop notch filters 4a, 4b, and 4c for rejecting the rotation harmonic fn are of the switched-capacitor type.

The band-stop filters 4a, 4b, and 4c receive a clock signal n.fn equal to an integer number n times the value of the electrical frequency fn of rotation of the rotor 10b, and each presents a central rejection frequency that is servo-controlled to the electrical frequency fn of rotation of the rotor 10b.

The clock frequency n.fn can be produced by a frequency multiplier circuit 3 having a phase-locked loop, on the basis of the electrical frequency fn of rotation of the rotor 10b as provided by the circuit 40 that generates synchronizing pulses.

The signals delivered by the band-stop filters 4a, 4b, 4c are applied to circuits 5a, 5b, 5c for measuring the harmonics that remain in said signals, including the value of the DC component that also contributes to heating.

The circuits 5a, 5b, 5c can be made using integrated circuits such as those used in square-law multimeters, of the true root-mean-square (rms) meter type.

Such square-law multimeters serve to measure the root mean square value of a complex periodic magnitude. As a result, in this example, circuits of this type take account of all of the signal components that contribute to heating, i.e. not only AC components of harmonics up to values beyond several tens of kilohertz, but also the DC component.

The output signals from the circuits 5a, 5b, 5c are applied in the form of DC signals, e.g. via diodes 6a, 6b, 6c, to a comparator circuit 7 that continuously compares the greatest of the three values with a predetermined alarm threshold Ref.

The output signal from the comparator 7 serves to open a relay contact 9 that is normally closed (represented symbolically in FIG. 1) in the event of the threshold Ref being exceeded by any one of the signals applied as inputs to the comparator 7.

When the contract 9 is opened, it produces a signal on lines 90, 91, 92 enabling it to control an emergency stop of the synchronous machine, in particular by acting on the converter 20, so as to preserve the integrity of the machine.

The invention is particularly useful when it is applied to monitoring the electric motor driving a turbomolecular pump, a turbomachine such as a compressor, or a tool-carrier spindle rotating at speeds of the order of several tens of thousands of rpm.

What is claimed is:

1. A circuit for monitoring harmonic distortion in the power supply of a synchronous electrical machine with permanent magnet excitation that comprises a rotor without a damper cage, a stator with first, second, and third windings, a frequency converter, and control circuits for controlling the frequency converter, the monitoring circuit comprising means for obtaining at least one signal representative of the current in the first winding of the stator and at least one signal representative of the current in the second winding of the stator; a circuit for generating synchronizing pulses reflecting the electrical frequency fn of rotation of the rotor relative to the stator; means for determining a signal representative of the current in the third winding of the stator; a set of band-stop notch filters respectively receiving said signals representative of the currents in the first, second, and third windings, and each presenting a center frequency that is servo-controlled to the electrical frequency fn of rotation of the rotor, in order to reject the harmonic corresponding to said electrical frequency fn; a set of measurement circuits for measuring the harmonics that remain in the signals output by each of the band-stop notch filters; and a comparator circuit for continuously comparing the greatest of the values of the signals from the measurement circuits relative to an alarm threshold.

2. A circuit according to claim 1, wherein the band-stop notch filters are of the switched capacitor type.

3. A circuit according to claim 1, wherein the band-stop notch filters present a clock frequency n.fn that is equal to an integer number n of times the value of the electrical frequency fn of rotation of the rotor.

4. A circuit according to claim 3, including a frequency multiplier circuit with a phase-locked loop for producing said clock frequency n.fn from the electrical frequency fn of rotation of the rotor delivered by said circuit for generating synchronizing pulses.

5. A circuit according to claim 1, wherein said means for determining the signal representative of the current in the third winding of the stator comprise an analog circuit for calculating the value of the current in the third winding from the measured values of the current in the second and third windings.

6. A circuit according to claim 1, wherein each of said measurement circuits for measuring the remaining harmonics comprises a measurement circuit of the squarelaw or multimeter type.

7. A circuit according to claim 1, further comprising filter elements interposed between the measurement circuits for measuring the remaining harmonics and the comparator circuit.

8. A circuit according to claim 1, wherein the circuit for generating synchronizing pulses comprises a "revolution pulse" type sensor for sensing the speed of rotation of the rotor.

9. A circuit according to claim 1, including means for taking signals representative of voltage for each phase outlet by the converter, and wherein said signals representative of the voltages and said signal representative of the current in the first winding of the stator are applied to the circuit for generating synchronizing pulses.

10. A unit for controlling a synchronous electrical machine with permanent magnet excitation that comprises a rotor without a damper cage and a stator with first, second, and third windings, which control unit comprises a frequency converter and control circuits for controlling the frequency converter, wherein the unit includes a circuit for monitoring harmonic distortion in the power supply to the synchronous machine according to claim 1, and wherein the circuit for generating synchronizing pulses representative of the electrical frequency fn of rotation of the rotor is incorporated in said control circuits for controlling the frequency converter.

11. A driver device for driving a rotary assembly mounted on active magnetic bearings, the driver device comprising a synchronous electrical machine fitted with a control unit according to claim 10.

12. A driver device according to claim 11, wherein the rotor of the synchronous machine comprises a massive shaft of magnetic steel having permanent magnets bonded to its surface, which magnets are also held by means of at least one binding band of carbon fibers or glass fibers.

13. A driver device according to claim 11, comprising a synchronous machine for driving a turbomolecular pump, a turbomachine, or a tool-carrier spindle rotating at speeds of the order of several tens of thousands of revolutions per minute.

* * * * *

UNITED STATES PATENT AND TRADEMARK OFFICE
CERTIFICATE OF CORRECTION

PATENT NO. : 7,397,216 B2 Page 1 of 1
APPLICATION NO. : 11/591233
DATED : July 8, 2008
INVENTOR(S) : Ulrich Schroeder et al.

It is certified that error appears in the above-identified patent and that said Letters Patent is hereby corrected as shown below:

Column 2, Line 59, "number n" should read --number $\underline{n}$--;

Column 6, Line 32, "number n" should read --number $\underline{n}$--; and

Column 7, claim 3, line 38, "number n" should read --number $\underline{n}$--.

Signed and Sealed this

Second Day of June, 2009

JOHN DOLL
*Acting Director of the United States Patent and Trademark Office*